(12) United States Patent
Qin et al.

(10) Patent No.: US 11,493,806 B2
(45) Date of Patent: Nov. 8, 2022

(54) LIGHT-EMITTING STRUCTURE, BACKLIGHT MODULE, DISPLAY MODULE, AND DISPLAY DEVICE

(71) Applicants: Shanghai AVIC OPTO Electronics Co.,Ltd., Shanghai (CN); Tianma Micro-Electronics Co., Ltd., Shenzhen (CN)

(72) Inventors: Feng Qin, Shanghai (CN); Zhiqi Chen, Wuhan (CN); Dandan Qin, Shanghai (CN); Shoufu Jian, Shanghai (CN)

(73) Assignees: Shanghai AVIC OPTO Electronics Co., Ltd., Shanghai (CN); Tianma Micro-Electronics Co., Ltd., Shenzhen (CN)

(*) Notice: Subject to any disclaimer, the term of this patent is extended or adjusted under 35 U.S.C. 154(b) by 61 days.

(21) Appl. No.: 17/125,535

(22) Filed: Dec. 17, 2020

(65) Prior Publication Data

US 2022/0137463 A1    May 5, 2022

(30) Foreign Application Priority Data

Oct. 30, 2020 (CN) .......................... 202011190483.8

(51) Int. Cl.
*G02F 1/1335* (2006.01)
*G02F 1/13357* (2006.01)
(Continued)

(52) U.S. Cl.
CPC .. *G02F 1/133628* (2021.01); *G02F 1/133603* (2013.01); *G02F 1/133605* (2013.01);
(Continued)

(58) Field of Classification Search
CPC ......... G02F 1/133628; G02F 1/133603; G02F 1/133605; G02F 1/133606;
(Continued)

(56) References Cited

U.S. PATENT DOCUMENTS 8,441,612 B2 * 5/2013 Ishida .................. H05B 3/0038
438/28
10,488,706 B1 * 11/2019 Zha .................... G02F 1/133605
(Continued)

FOREIGN PATENT DOCUMENTS

| CN | 101614909 A | 12/2009 |
| CN | 202274376 U | 6/2012 |
| CN | 104037302 A | 9/2014 |

OTHER PUBLICATIONS

CN 101614909A machine translation (Year: 2009).*
CN 104037302A_machine translation (Year: 2014).*

*Primary Examiner* — Tracie Y Green
(74) *Attorney, Agent, or Firm* — Anova Law Group, PLLC

(57) ABSTRACT

A light-emitting structure, a backlight module, a display module, and a display device are provided. The light-emitting structure includes a circuit substrate, including a first surface and a second surface sequentially arranged along a light-exiting direction of the light-emitting structure. The circuit substrate also includes a light-transparent substrate and a wiring structure located on a side of the light-transparent substrate in a thickness direction. The light-emitting structure also includes a plurality of light-emitting elements, arranged in an array on one of the first surface or the second surface of the circuit substrate. The plurality of the light-emitting elements is electrically connected to the wiring structure. The light-emitting structure also includes a heat sink, located on a side of the first surface of the circuit substrate. The heat sink is configured for dissipating heat generated by the plurality of the light-emitting elements.

19 Claims, 8 Drawing Sheets

(51) Int. Cl.
  *H01L 25/075* (2006.01)
  *H01L 33/08* (2010.01)
  *H01L 33/42* (2010.01)
  *H01L 33/46* (2010.01)
  *H01L 33/62* (2010.01)
  *H01L 33/64* (2010.01)
(52) U.S. Cl.
  CPC .. *G02F 1/133606* (2013.01); *G02F 1/133611* (2013.01); *G02F 1/133612* (2021.01); *H01L 25/0753* (2013.01); *H01L 33/08* (2013.01); *H01L 33/42* (2013.01); *H01L 33/46* (2013.01); *H01L 33/62* (2013.01); *H01L 33/64* (2013.01)
(58) Field of Classification Search
  CPC ......... G02F 1/133611; G02F 1/133612; H01L 25/0753; H01L 33/08; H01L 33/42; H01L 33/46; H01L 33/62; H01L 33/64
  See application file for complete search history.

(56) References Cited

U.S. PATENT DOCUMENTS

| | | | |
|---|---|---|---|
| 2005/0156310 A1* | 7/2005 | Benner | G02B 6/4249 257/712 |
| 2005/0175838 A1* | 8/2005 | Greinke | C04B 35/522 428/408 |
| 2014/0268780 A1* | 9/2014 | Wang | F21V 19/003 362/249.06 |
| 2016/0298828 A1* | 10/2016 | Chang | G02F 1/133605 |
| 2018/0341151 A1* | 11/2018 | Kurita | G02F 1/133608 |
| 2019/0178479 A1* | 6/2019 | Liu | G03B 15/02 |
| 2020/0301202 A1* | 9/2020 | Cheng | G02F 1/133603 |
| 2021/0020114 A1* | 1/2021 | Lee | G09G 3/342 |
| 2021/0033925 A1* | 2/2021 | Kim | G02F 1/133605 |
| 2021/0149230 A1* | 5/2021 | Lee | G02F 1/133606 |
| 2021/0302786 A1* | 9/2021 | Ma | G02B 6/005 |

* cited by examiner

LIGHT-EMITTING STRUCTURE, BACKLIGHT MODULE, DISPLAY MODULE, AND DISPLAY DEVICE

CROSS-REFERENCE TO RELATED APPLICATION

This application claims priority of Chinese Patent Application No. 202011190483.8, filed on Oct. 30, 2020, the entire content of which is hereby incorporated by reference.

FIELD OF THE DISCLOSURE

The present disclosure generally relates to the field of display technology and, more particularly, relates to a light-emitting structure, a backlight module, a display module, and a display device.

BACKGROUND

To realize light-emitting display of a display device, the display device may include a light-emitting element. The light-emitting display of the display device may be realized by light emission of the light-emitting element.

With development of display devices, users may have higher requirements for light-emission efficiency of display devices. During a light-emitting display process of a display device, if a structure of the display device is not properly configured, heat may be accumulated at the light-emitting element of the display device, and the light-emission efficiency of the display device may thus be affected.

The disclosed structures and methods are directed to solve one or more problems set forth above and other problems in the art.

SUMMARY

One aspect of the present disclosure includes a light-emitting structure. The light-emitting structure includes a circuit substrate, including a first surface and a second surface sequentially arranged along a light-exiting direction of the light-emitting structure. The circuit substrate also includes a light-transparent substrate and a wiring structure located on a side of the light-transparent substrate in a thickness direction. The light-emitting structure also includes a plurality of light-emitting elements, arranged in an array on one of the first surface or the second surface of the circuit substrate. The plurality of the light-emitting elements is electrically connected to the wiring structure. The light-emitting structure also includes a heat sink, located on a side of the first surface of the circuit substrate. The heat sink is configured for dissipating heat generated by the plurality of the light-emitting elements.

Another aspect of the present disclosure includes a backlight module. The backlight module includes a light-emitting structure. The light-emitting structure includes a circuit substrate, including a first surface and a second surface sequentially arranged along a light-exiting direction of the light-emitting structure. The circuit substrate also includes a light-transparent substrate and a wiring structure located on a side of the light-transparent substrate in a thickness direction. The light-emitting structure also includes a plurality of light-emitting elements, arranged in an array on one of the first surface or the second surface of the circuit substrate. The plurality of the light-emitting elements is electrically connected to the wiring structure. The light-emitting structure also includes a heat sink, located on a side of the first surface of the circuit substrate. The heat sink is configured for dissipating heat generated by the plurality of the light-emitting elements. The backlight module also includes at least one optical film layer, located on a side of the second surface of the circuit substrate of the light-emitting structure.

Another aspect of the present disclosure includes a display device. The display device includes a display module. The display module includes a light-emitting structure. The light-emitting structure includes a circuit substrate, including a first surface and a second surface sequentially arranged along a light-exiting direction of the light-emitting structure. The circuit substrate also includes a light-transparent substrate and a wiring structure located on a side of the light-transparent substrate in a thickness direction. The light-emitting structure also includes a plurality of light-emitting elements, arranged in an array on one of the first surface or the second surface of the circuit substrate. The plurality of the light-emitting elements is electrically connected to the wiring structure. The light-emitting structure also includes a heat sink, located on a side of the first surface of the circuit substrate. The heat sink is configured for dissipating heat generated by the plurality of the light-emitting elements. The backlight module also includes at least one optical film layer, located on a side of the second surface of the circuit substrate of the light-emitting structure.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
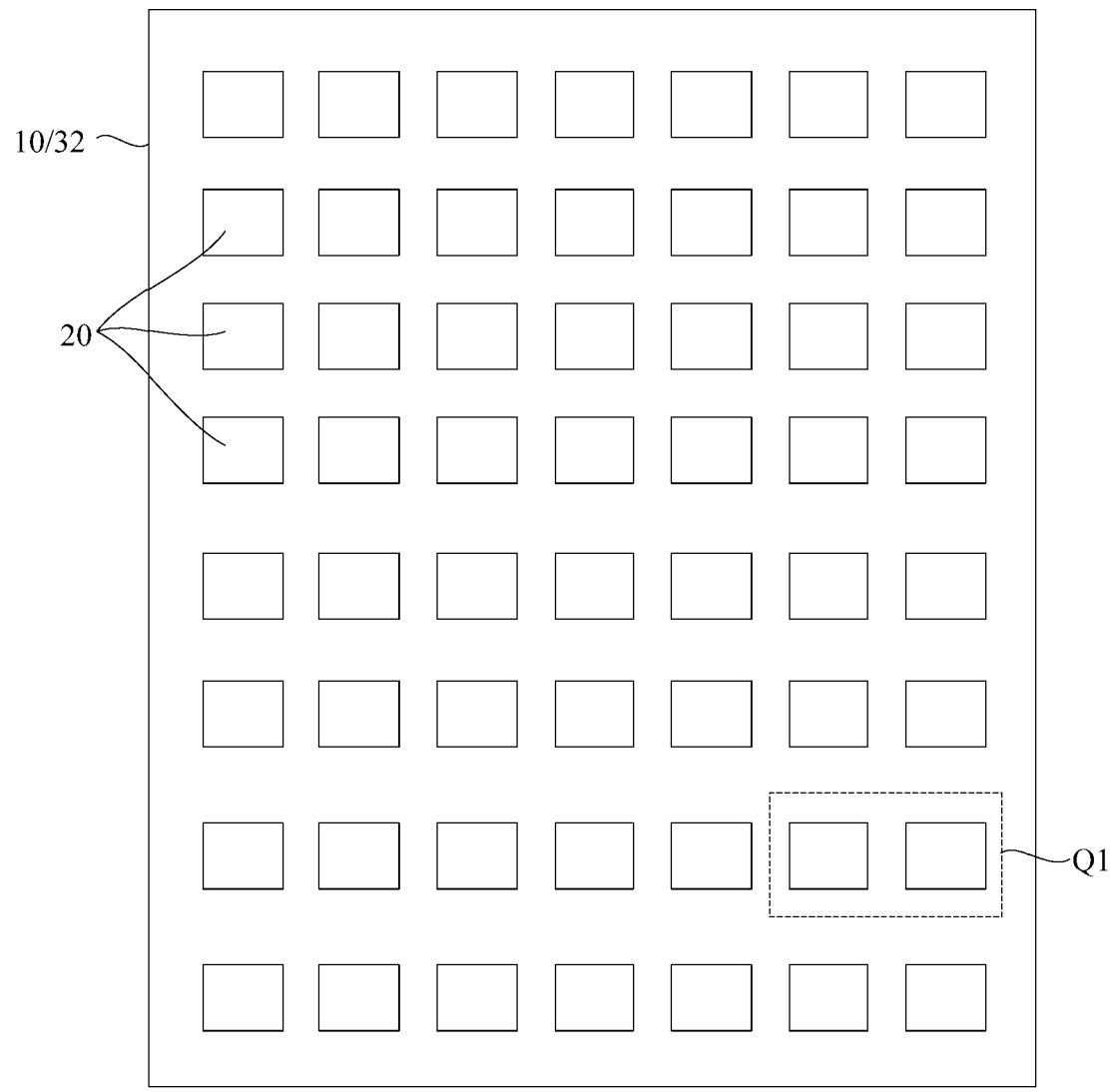
FIG. 1 illustrates a schematic top view of a light-emitting structure consistent with the disclosed embodiments of the present disclosure.

To make the objectives, technical solutions and advantages of the present disclosure clearer and more explicit, the present disclosure is described in further detail with accompanying drawings and embodiments. It should be understood that the specific exemplary embodiments described herein are only for explaining the present disclosure and are not intended to limit the present disclosure.

Reference will now be made in detail to exemplary embodiments of the present disclosure, which are illustrated in the accompanying drawings. Wherever possible, the same reference numbers will be used throughout the drawings to refer to the same or like parts.

It should be noted that relative arrangements of components and steps, numerical expressions and numerical values set forth in exemplary embodiments are for illustration purpose only and are not intended to limit the present disclosure unless otherwise specified. Techniques, methods and apparatus known to the skilled in the relevant art may not be discussed in detail, but these techniques, methods and apparatus should be considered as a part of the specification, where appropriate.

It should be noted that in the present disclosure, relational terms such as "first" and "second" are used only to distinguish one entity or operation from another entity or operation, and do not necessarily require or imply any such actual relationship or order between these entities or operations. Moreover, terms "include", "comprise" or any other variations thereof are intended to cover non-exclusive inclusion. A process, a method, an article, or an equipment including a series of elements may not only include those elements, but also include other elements that are not explicitly listed, or elements inherent to the process, the method, the article, or the equipment. Without additional restrictions, when a phrase "including . . . " is used to identify an element, other identical elements may exist in a process, a method, an article, or an equipment including the element.

It should be understood that, in describing a structure of a component, when a layer or an region is referred to as being "on" or "above" another layer or another region, the layer or the region may be directly on the other layer or the other region, or additional layers or additional regions may be included between the layer or the region and the other layer or the other region. Moreover, if the component is turned over, the layer or the region is "below" or "under" the other layer or the other region.

It should be understood that features, structures or characteristics described in the present disclosure may be combined in one or more embodiments.

The present disclosure provides a light-emitting structure 100, a backlight module, a display module, and a display device. The light-emitting structure 100, the backlight module, the display module, and the display device provided by the present disclosure are described in detail below with reference to accompanying drawings.

Figure 2:
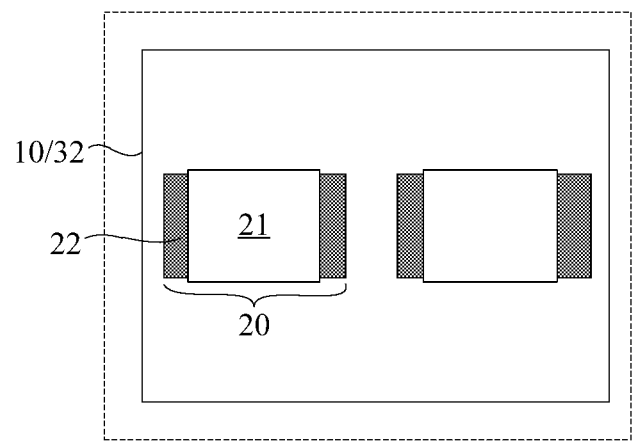
FIG. 2 illustrates an enlarged schematic diagram at Q1 of a light-emitting structure shown in FIG. 1, consistent with the disclosed embodiments of the present disclosure.
Figure 3:
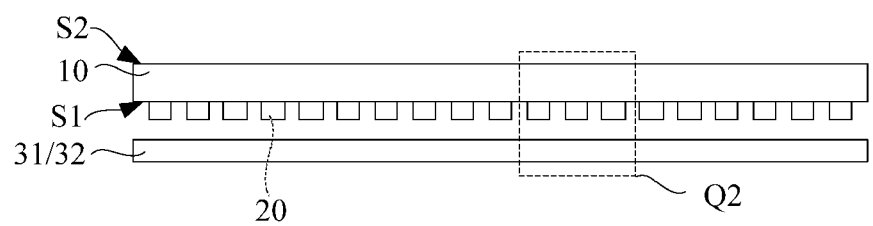
FIG. 3 illustrates a schematic cross-sectional view of a light-emitting structure consistent with the disclosed embodiments of the present disclosure.
Figure 4:
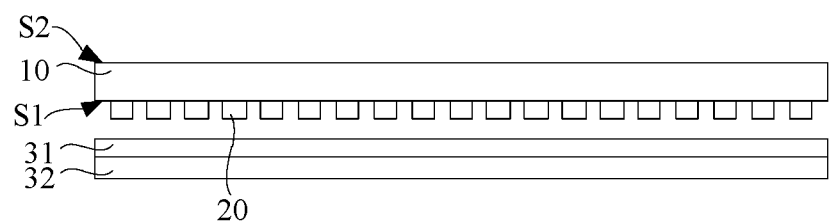
FIG. 4 illustrates a schematic cross-sectional view of another light-emitting structure consistent with the disclosed embodiments of the present disclosure.
Figure 5:
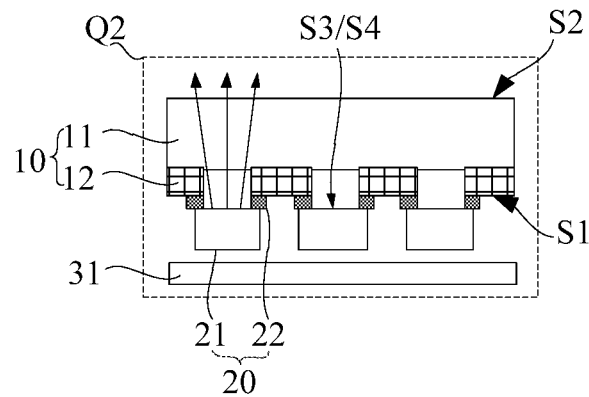
FIG. 5 illustrates an enlarged schematic diagram at Q2 of a light-emitting structure shown in FIG. 3, consistent with the disclosed embodiments of the present disclosure.

FIG. 1 illustrates a schematic top view of a light-emitting structure consistent with the disclosed embodiments of the present disclosure. FIG. 2 illustrates an enlarged schematic diagram at Q1 of a light-emitting structure shown in FIG. 1. FIG. 3 illustrates a schematic cross-sectional view of a light-emitting structure consistent with the disclosed embodiments of the present disclosure. FIG. 4 illustrates a schematic cross-sectional view of another light-emitting structure consistent with the disclosed embodiments of the present disclosure. FIG. 5 illustrates an enlarged schematic diagram at Q2 of a light-emitting structure shown in FIG. 3. A cross-sectional schematic diagram in the accompanying drawings is a schematic diagram obtained by taking a cross-section in a direction perpendicular to a plane of a light-emitting structure. As shown in FIG. 1 to FIG. 5, the present disclosure provides a light-emitting structure 100. The light-emitting structure 100 includes a circuit substrate 10, a plurality of light-emitting elements 20, and a heat sink 31.

The circuit substrate 10 includes a first surface S1 and a second surface S2 sequentially arranged along a light-exiting direction of the light-emitting structure 100. The circuit substrate 10 also includes a light-transparent substrate 11 and a wiring structure 12 located on a side of the light-transparent substrate 11 in a thickness direction. The plurality of light-emitting elements 20 are arranged in an array on one of the first surface S1 or the second surface S2 of the circuit substrate 10. The light-emitting element 20 is electrically connected to the wiring structure 12. By transmitting an electrical signal in the wiring structure 12, the light-emitting element 20 may emit light and display. The heat sink 31 is located on a side of the first surface S1 of the circuit substrate 10. The heat sink 31 is configured for dissipating heat generated by the light-emitting element 20. The heat sink 31 may have good thermal conductivity, may transmit heat generated during operation of the light-emitting element 20 in time, and dissipate the heat to an external environment. On the other hand, with the heat sink 31, the light-emitting element 20 may exchange heat with an external environment at a lower temperature, thus a problem of heat in the light-emitting element 20 may be alleviated. In one embodiment, the heat sink 31 may be made of a material with good thermal conductivity, such that the heat generated by the light-emitting element 20 may be well dissipated.

The light-emitting element 20 may generate heat during a light-emitting display process. When the heat generated may not be well dissipated, light-emission efficiency of the light-emitting element 20 may be affected. To address this issue, in a light-emitting structure 100 provided by the present disclosure, a heat sink 31 may be disposed on a side of the first surface S1 in the light-exiting direction of the circuit substrate 10, such that the heat sink 31 may dissipate the heat generated by the light-emitting element 20 during operation. Accordingly, the light-emitting element 20 may be prevented from accumulating heat, a problem of accumulating heat by the light-emitting element 20 may be alleviated, and the light-emission efficiency of the light-emitting element 20 may be improved. In addition, by disposing the heat sink 31 on the side of the first surface S1 of the circuit substrate 10, the heat sink 31 may be prevented from blocking the light emitted by the light-emitting element 20, and the light-emission brightness of the light-emitting structure 100 may be improved.

The light-emitting structure 100 provided by the present disclosure may be applied to a backlight module of a liquid crystal display device. The liquid crystal display device may include a liquid crystal display panel and a backlight module. The backlight module is configured to provide a light source for the liquid crystal display panel, such that the liquid crystal display panel may emit light and display. In addition, the light-emitting structure 100 may also directly emit light for display. In one embodiment, the plurality of light-emitting elements 20 arranged in an array may include a plurality of light-emitting elements 20 with different light-emitting colors. The plurality of light-emitting elements 20 may include a red light-emitting element 20, a green light-emitting element 20, and a blue light-emitting element 20. In some embodiments, the plurality of light-emitting elements 20 may also include a white light-emitting element 20 or a yellow light-emitting element 20.

In some embodiments, the light-emitting element 20 may be a secondary light-emitting element (Mini-LED), a micro light-emitting element (Micro LED) or a light-emitting diode (LED). By disposing the light-emitting elements 20 arranged in an array on the light-transparent substrate 11, the number of light-emitting elements 20 may be increased. Accordingly, the light-emission brightness of the light-emitting structure 100 may be increased, and the light-emitting effect of the light-emitting structure 100 may be improved. In one embodiment, the light-emitting elements 20 may be arranged in an array along a row direction and a column direction of the light-transparent substrate 11, such that partition control of the light-emitting elements 20 may be realized. In one embodiment, the light-emitting elements 20 arranged in an array are divided into a plurality of dimming areas, and brightness of each dimming area may be controlled.

As shown in FIG. 3 and FIG. 4, to support the circuit substrate 10 and the light-emitting elements 20, and to prevent damage to the light-emitting elements 20, in some embodiments, the light-emitting structure 100 also includes a support frame 32. The support frame 32 is located on the side of the first surface S1 of the circuit substrate 10. To improve the supporting effect of the supporting frame 32, in one embodiment, the supporting frame 32 may be made of a metal material. For example, the supporting frame 32 may be a steel plate. Since a metal material may have good heat transmission and heat dissipation effects, the support frame 32 may be multiplexed as the heat sink 31, such that the heat emitted by the light-emitting element 20 may be transmitted and dissipated. In some other embodiments, when the light-emitting structure 100 includes the support frame 32, the support frame 32 may also be located on a side of the heat sink 31 away from the circuit substrate 10, such that a better support effect may be achieved. In addition, the support frame 32 may also quickly dissipate the heat transmitted by the heat sink 31, such that temperature of the light-emitting elements 20 during operation may be decreased.

When the light-emitting structure 100 is applied to a backlight module, at least one optical film layer may be disposed on a side of the second surface S2 of the light-emitting structure 100. The light-transparent substrate 11 may be made of glass or polyimide (PI), and the light-transparent substrate 11 may have a poor heat dissipation effect. The at least one optical film layer may include a film layer such as a diffuser, and the diffuser may have a poor heat dissipation effect. If light-emitting element 20 is located between the light-transparent substrate 11 and the at least one optical film layer, the heat generated by the light-emitting element 20 located between the light-transparent substrate 11 and the at least one optical film layer may not be well dissipated, resulting in low light-emission efficiency of the light-emitting element 20. To address this issue, in some embodiments, the light-emitting element 20 is located between the first surface S1 of the circuit substrate 10 and the heat sink 31. In this configuration, the light-emitting element 20 is closer to the heat sink 31, such that the heat sink 31 may better transmit the heat generated by the light-emitting element 20 in time. As a result, the influence of heat on the light-emission efficiency of the light-emitting element 20 may be reduced.

When the light-emitting structure 100 is a rigid light-emitting structure, the heat sink 31 may be a rigid heat sink. For example, the heat sink 31 may be multiplexed as the support frame 32, and the heat sink 31 may be supported by a metal material. When the light-emitting structure 100 is a flexible light-emitting structure, the heat sink 31 may be a flexible heat sink. For example, the flexible heat sink may be a graphite heat sink, and thus the heat sink 31 may not affect bending performance of the light-emitting structure 100.

With reference to FIG. 2 and FIG. 5, the light-emitting element 20 may include a light-emitting block 21 and a pad 22 mounted on a side surface of the light-emitting block 21. The light-emitting block 21 is connected to the circuit substrate 10 through the pad 22. Specifically, as shown in FIG. 5, the pad 22 of the light-emitting element 20 may be fixed on the circuit substrate 10 by soldering.

Figure 6:
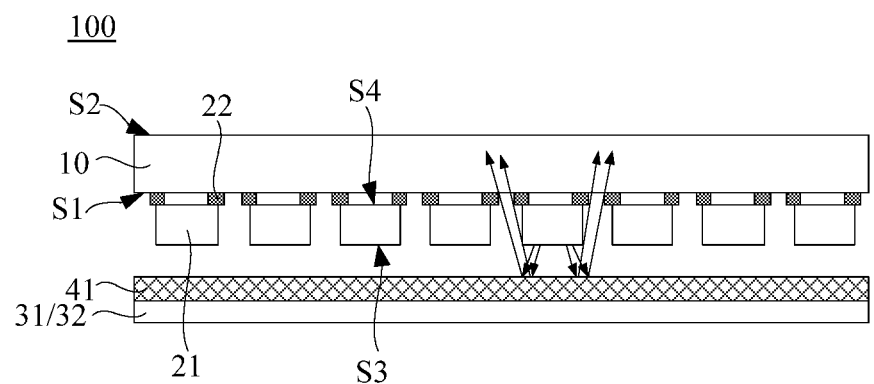
FIG. 6 illustrates a schematic cross-sectional view of another light-emitting structure consistent with the disclosed embodiments of the present disclosure.

FIG. 6 illustrates a schematic cross-sectional view of another light-emitting structure consistent with the disclosed embodiments of the present disclosure. With reference to FIG. 6, in some embodiments, the light-emitting block 21 includes a light-exiting surface S3. The light-exiting surface S3 is disposed opposite to a mounting surface S4 of the pad 22. The light-emitting structure 100 also includes a first reflective layer 41 located between the light-emitting block 21 and the heat sink 31. In one embodiment, the light-exiting surface S3 and the mounting surface S4 of the pad 22 are arranged oppositely. FIG. 6 illustrates a schematic diagram of light (straight lines with arrows). As shown in FIG. 6, at this configuration, the light emitted by the light-emitting element 20 is emitted toward the heat sink 31, and is opposite to the light-exiting direction of the light-emitting structure 100 (from the first surface S1 to the second surface S2). To make the light emitted by the light-emitting element 20 be emitted toward the second surface S2 of the light-emitting structure 100, the light emitted by the light-emitting element 20 is reflected by the first reflective layer 41 to change the direction of the light emitted by the light-emitting element 20, such that the light-emitting structure 100 emits light to a side of the second surface S2. Through this configuration, the light-emitting display of the light-emitting structure 100 may be realized, and the light emitted by the light-emitting elements 20 may be mixed with each other after the light emitted by the light-emitting elements 20 passes through the first reflective layer 41. Accordingly, the light mixing distance along the thickness direction of the light-emitting structure 100 may be increased, and the optical density (OD) value may be increased. As such, when the light-emitting structure 100 performs light-emitting display, uneven brightness due to darkness in areas between the plurality of light-emitting elements 20 may be prevented. Thus, light emission uniformity of the light-emitting structure 100 may be improved.

Figure 7:
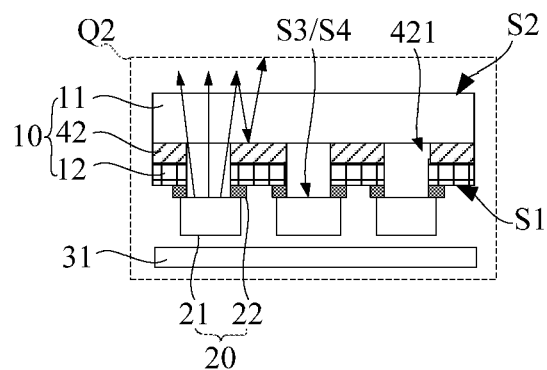
FIG. 7 illustrates an enlarged schematic diagram at Q2 of another light-emitting structure shown in FIG. 3, consistent with the disclosed embodiments of the present disclosure.

FIG. 7 illustrates an enlarged schematic diagram at Q2 of another light-emitting structure shown in FIG. 3. With reference to FIG. 7, in some embodiments, the light-emitting element 20 also includes a pad 22 mounted on a side surface of the light-emitting block 21, and the light-emitting block 21 is connected to the circuit substrate 10 through the pad 22. The light-emitting block 21 has a light-exiting surface S3. The light-exiting surface S3 and the mounting surface S4 of the pad 22 are on a same plane. In this configuration, the direction of light emitted by the light-emitting element 20 is same as the direction of light emitted by the light-emitting structure 100. Since the light-emitting element 20 is located between the heat sink 31 and the circuit substrate 10, the heat sink 31 may efficiently transmit the heat generated by the light-emitting element 20 during operation, preventing the light-emitting element 20 from overheating. Thus, the light-emission efficiency of the light-emitting structure 100 may be improved.

When the light-emitting element 20 is located between the heat sink 31 and the circuit substrate 10, part of the light emitted by the light-emitting element 20 may be reflected by other film structures, forming stray light. For example, when the light-emitting structure 100 is applied to a backlight module, part of the light emitted by the light-emitting element 20 may be reflected by the at least one optical film layer on the backlight module, and thus the light-emission efficiency of the light-emitting structure 100 may be affected. To improve the light-emitting effect of the light-emitting structure 100 and alleviate the uneven brightness of the light-emitting structure 100, in some embodiments, as shown in FIG. 7, the wiring structure 12 is located on a side of the light-transparent substrate 11 facing the light-emitting element 20. The circuit substrate 10 may also include a second reflective layer 42 located between the wiring structure 12 and the light-transparent substrate 11. The second reflective layer 42 includes a first opening 421 penetrating the second reflective layer 42 along a thickness direction of the second reflective layer 42. An orthographic projection of the light-emitting element 20 on the light-transparent substrate 11 is located within an orthographic projection of the first opening 421 on the light-transparent substrate 11. In this configuration, the orthographic projection of the second reflective layer 42 on the light-transparent substrate 11 is located on an outer peripheral side of the orthographic projection of the light-emitting element 20 on the light-transparent substrate 11. Accordingly, the second reflective layer 42 may reflect the stray light of the light-emitting element 20 without affecting the light emitted by the light-emitting element 20. As such, the light output of the light-emitting structure 100 may be increased, and the light-emitting effect of the light-emitting element 20 may be improved. Furthermore, since the second reflective layer 42 is disposed, the light-emitting structure 100 may have a larger amount of light output. Accordingly, the electric current transmitted in the light-emitting element 20 may be appropriately reduced, such that the light output of the light-emitting element 20 may meet requirements. As such, the heat generated by the light-emitting element 20 may be reduced, and meanwhile, the light-emitting element 20 may have higher light-emission efficiency.

When the light-emitting element 20 is a micro light-emitting element 20, a size of the micro light-emitting element 20 may be small. Compared with LEDs, more micro light-emitting elements 20 may be arranged within a same planar area of the light-transparent substrate 11, and an interval between adjacent micro light-emitting elements 20 may be small. In this case, the wiring structure 12 may be vapor-deposited on the light-transparent substrate 11 by an evaporation process. To control the light emission of the micro light-emitting element 20, the wiring structure 12 may include a scan line, a data line, and a power signal line. The light-emitting element 20 may be located in an area defined by the scan line, the data line and the power line.

In one embodiment, the wiring structure 12 may also include a control circuit for controlling the light emission of the light-emitting element 20. The control circuit may be a thin film transistor (TFT). The thin film transistor includes a gate layer on a side of the light-transparent substrate 11 and a source and drain layer on a side of the gate layer away from the light-transparent substrate 11. In one embodiment, to prevent the gate layer of the thin film transistor from being exposed to light and generating photo-generated carriers and thus affecting the characteristics of the thin film transistor, as shown in FIG. 7, the wiring structure 12 is located on a side of the second reflective layer 42 away from the light-transparent substrate 11. The second reflective layer 42 may effectively reflect light, and prevent the light emitted by the light-emitting element 20 from irradiating the wiring structure 12 and affecting electrical parameters of the wiring structure 12.

In one embodiment, in a manufacturing process of the circuit substrate 100, the second reflective layer 42 is vapor-deposited on the light-transparent substrate 11 first. The second reflective layer 42 includes a first opening 421 penetrating the second reflective layer 42 along a thickness direction of the second reflective layer 42. Then, the wiring structure 12 is vapor-deposited on a surface of the second reflective layer 42 facing away from the light-transparent substrate 11. After that, the light-emitting element 20 is disposed on a side of the wiring structure 12 facing away from the second reflective layer 42, and is fixedly connected to the circuit substrate 10 through the pad 22 of the light-emitting element 20. The wiring structure fabricated by the vapor deposition process may have high accuracy, such that accurate control of the light-emitting display of each light-emitting element 20 may be achieved.

In one embodiment, when the light-emitting element 20 is an LED, the wiring structure 12 may be a flexible circuit board (FPC) or a printed circuit board (PCB). The FPC or PCB includes conductive wires. The light-emitting display of the light-emitting element 20 may be controlled by transmitting electrical signals in the conductive wires.

Figure 8:
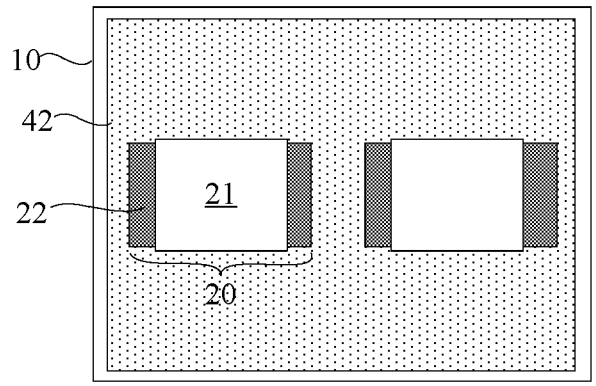
FIG. 8 illustrates an enlarged schematic diagram at Q1 of another light-emitting structure shown in FIG. 1, consistent with the disclosed embodiments of the present disclosure.

FIG. 8 illustrates an enlarged schematic diagram at Q1 of another light-emitting structure shown in FIG. 1. In some embodiments, with reference to FIG. 8, a contour of the orthographic projection of the light-emitting element 20 on the light-transparent substrate 11 at least partially overlaps with a contour of the orthographic projection of the first opening 421 on the light-transparent substrate 11. In this configuration, the second reflective layer 42 has a large reflective surface. When the light emitted by the light-emitting element 20 is reflected by other film structures, for example, by a diffuser, the second reflective layer 42 may reflect the light again to a great extent. Accordingly, the light emitted by the light-emitting element 20 may be increased, the light-emission brightness of the light-emitting element 20 may be improved, and thus the light-emitting efficiency of the light-emitting element 20 may be improved.

Figure 9:
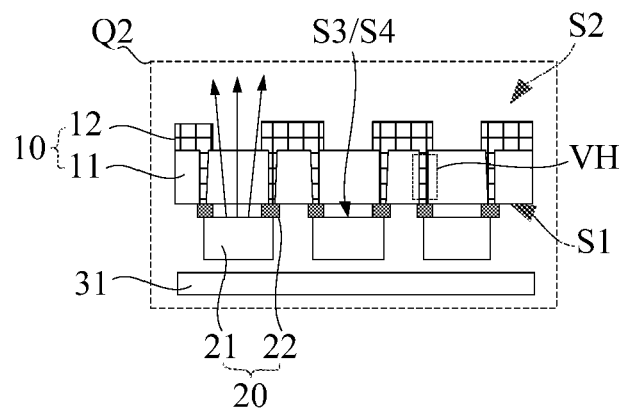
FIG. 9 illustrates an enlarged schematic diagram at Q2 of another light-emitting structure shown in FIG. 3, consistent with the disclosed embodiments of the present disclosure.

FIG. 9 illustrates an enlarged schematic diagram at Q2 of another light-emitting structure shown in FIG. 3. With reference to FIG. 9, when the light-emitting element 20 is located between the circuit substrate 10 and the heat sink 31, in some embodiments, the wiring structure 12 is located on the side of the light-transparent substrate 11 facing away from the light-emitting element 20, and the light-emitting element 20 is connected to the wiring structure 12 through a via VH. In a specific implementation, the via VH may be located on the light-transparent substrate 11, and the wiring structure 12 may be disposed on the side of the light-transparent substrate 11 away from the light-emitting element 20. In this case, the light-emitting element 20 may be connected to the wiring structure 12 through the via VH, and thus stable electrical connection between the light-emitting element 20 and the wiring structure may be achieved.

Figure 10:
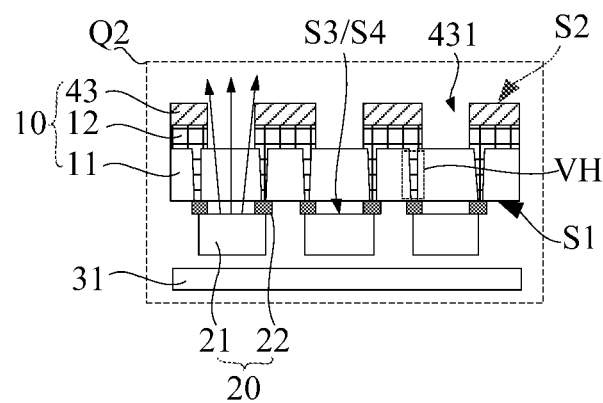
FIG. 10 illustrates an enlarged schematic diagram at Q2 of another light-emitting structure shown in FIG. 3, consistent with the disclosed embodiments of the present disclosure.

FIG. 10 illustrates an enlarged schematic diagram at Q2 of another light-emitting structure shown in FIG. 3. With reference to FIG. 10, based on the light-emitting structure 100 shown in FIG. 9, in some embodiments, the circuit substrate 10 also includes a third reflective layer 43 on a side of the wiring structure 12 facing away from the light-transparent substrate 11. The third reflective layer 43 includes a light transmission hole 431 penetrating the third reflective layer 43 along a thickness direction of the third reflective layer 43. An orthographic projection of the light-emitting element 20 on the light-transparent substrate 11 is located within an orthographic projection of the light transmission hole 431 on the light-transparent substrate 11. Through this configuration, on one hand, the third reflective layer 43 may reflect the stray light of the light-emitting element 20, thereby increasing the amount of light emitted by the light-emitting structure 100, and thus increasing the light-emission brightness of the light-emitting structure 100. On the other hand, when the wiring structure 12 includes a thin film transistor, since the third reflective layer 43 is located on the side of the wiring structure 12 away from the light-transparent substrate 11, the light emitted by the light-emitting element 20 may be prevented from irradiating the wiring structure 12 and affecting electrical parameters of the wiring structure 12.

Figure 11:
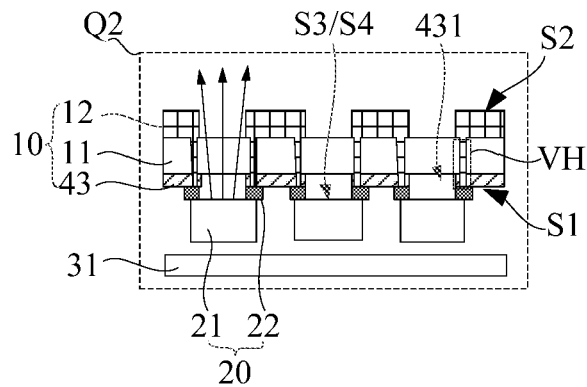
FIG. 11 illustrates an enlarged schematic diagram at Q2 of another light-emitting structure shown in FIG. 3, consistent with the disclosed embodiments of the present disclosure.

FIG. 11 illustrates an enlarged schematic diagram at Q2 of another light-emitting structure shown in FIG. 3. With reference to FIG. 11, based on the light-emitting structure 100 shown in FIG. 9, in one embodiment, the circuit substrate 10 may also include a third reflective layer 43 located between the light-transparent substrate 11 and the light-emitting element 20. The third reflective layer 43 includes a light transmission hole 431 penetrating the third reflective layer 43 along a thickness direction of the third reflective layer 43. An orthographic projection of the light-emitting element 20 on the light-transparent substrate 11 is located within an orthographic projection of the light transmission hole 431 on the light-transparent substrate 11. Through this configuration, the third reflective layer 43 may reflect the stray light of the light-emitting element 20, thereby increasing the amount of light emitted by the light-emitting structure 100, and thus increasing the light-emission brightness of the light-emitting structure 100.

Figure 12:
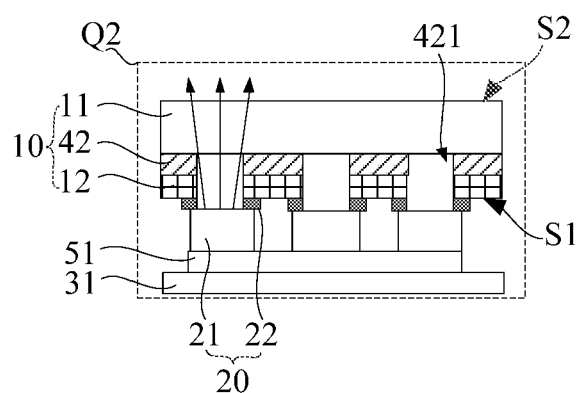
FIG. 12 illustrates an enlarged schematic diagram at Q2 of another light-emitting structure shown in FIG. 3, consistent with the disclosed embodiments of the present disclosure.

FIG. 12 illustrates an enlarged schematic diagram at Q2 of another light-emitting structure shown in FIG. 3. With reference to FIG. 12, when the light-emitting element 20 is located between the heat sink 31 and the circuit substrate 10, to prevent the light-emitting element 20 from being damaged by the heat sink 31, in some embodiments, the light-emitting structure 100 may also include a protective component 51. The protective component 51 is located between the heat sink 31 and the light-emitting element 20. In one embodiment, the protective component 51 may be made of foam. The protective component may have a preset buffering effect and may protect the light-emitting element 20. To reduce the influence of the protective component 51 on the heat dissipation performance of the heat sink 31, a heat dissipation channel may be provided on the protective component 51. The heat dissipation channel may penetrate the protective component 51 along a thickness direction of the protective component 51. The heat generated by the light-emitting element 20 may be transmitted to the heat sink 31 through the heat dissipation channel, and the heat sink 31 may then dissipate the heat. As such, the protective component 51 may provide a protection to the light-emitting element 20, and meanwhile the heat dissipation function of the heat sink 31 may not be affected.

Figure 13:
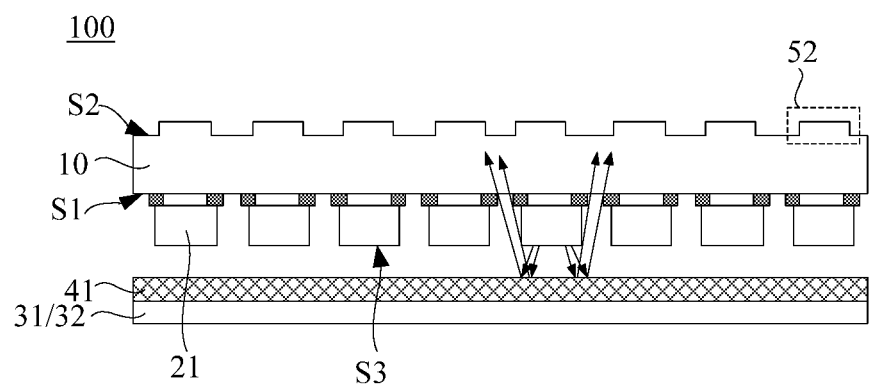
FIG. 13 illustrates a schematic cross-sectional view of another light-emitting structure consistent with the disclosed embodiments of the present disclosure.

FIG. 13 illustrates a schematic cross-sectional view of another light-emitting structure consistent with the disclosed embodiments of the present disclosure. In light-emitting structure, a plurality of light-emitting elements 20 may be arranged in an array on the light-transparent substrate 11, and the plurality of light-emitting elements 20 may be arranged at intervals. An area between the plurality of light-emitting elements 20 may be dark, and uneven brightness may occur when the light-emitting structure emits light. To address this issue, in some embodiments, with reference to FIG. 13, the circuit substrate 10 may include an array of protruding structures arranged on a surface of the light-transparent substrate 11. The protruding structure 52 may extend from a surface of the light-transparent substrate 11 away from the discrete heat element 31 in a direction away from the heat dissipation element 31.

The protruding structure 52 may be arranged directly opposite to the light-emitting element 20. Or, an orthographic projection of the protruding structure 52 on the light-transparent substrate 11 may be located between the orthographic projections of two adjacent light-emitting elements 20 on the light-transparent substrate 11. By disposing the protruding structure 52 on the circuit substrate 10, the light emitted by the light-emitting element 20 may change optical paths at the protruding structure 52. As such, the protruding structures 52 may play a role of spreading an light-emitting angle of the light-emitting element 20. Accordingly, when the light-emitting structure emits light, the uneven brightness caused by darkness of the light in the area between the plurality of light-emitting elements 20 may be avoided. Thus, the light emission uniformity of the light-emitting structure 100 may be improved.

In some embodiments, as shown in FIG. 11, to fabricate the protruding structure 52 and make the protruding structure 52 to be stably connected to the circuit substrate 10, the protruding structure 52 and the light-transparent substrate 11 may be integrally formed. In this case, the protruding structure 52 and the light-transparent substrate 11 are made of a same material. In a specific implementation, a surface of the light-transparent substrate 11 away from the heat sink 31 may be etched to form a plurality of protruding structures 52. It is understandable that the protruding structure 52 may also be fabricated separately from the light-transparent substrate 11, and the protruding structure 52 may be connected to the light-transparent substrate 11 through optical glue. In this case, the protruding structure 52 and the light-transparent substrate 11 may be made of a same material or different materials, as long as the protruding structure 52 may effectively diffuse the light emitted by the light-emitting element 20.

As shown in FIG. 13, the circuit substrate 10 may include the protruding structures 52 arranged in an array on the surface of the light-transparent substrate 11, and a first reflective layer 41 may also be disposed between the heat sink 31 and the light-emitting element 20. The first reflective layer 41 may mix the light emitted by the light-emitting element 20, and then the protruding structure 52 may diffuse the light, and the light-emission efficiency of the light-emitting structure 100 may thus be improved. In this case, the first reflective layer 41 may be a reflective sheet, and the first reflective layer 41 may be fixedly connected to the heat sink 31 by adhesive glue. It is understandable that the protruding structure 52 may also be disposed on the light-transparent substrate 11 of the light-emitting structure 100 shown in FIG. 7.

Figure 14:
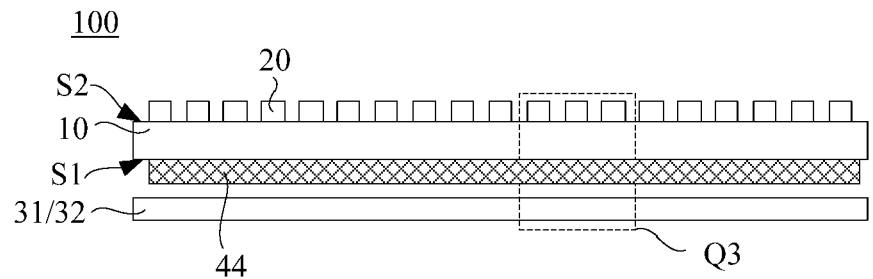
FIG. 14 illustrates a schematic cross-sectional view of another light-emitting structure consistent with the disclosed embodiments of the present disclosure.
Figure 15:
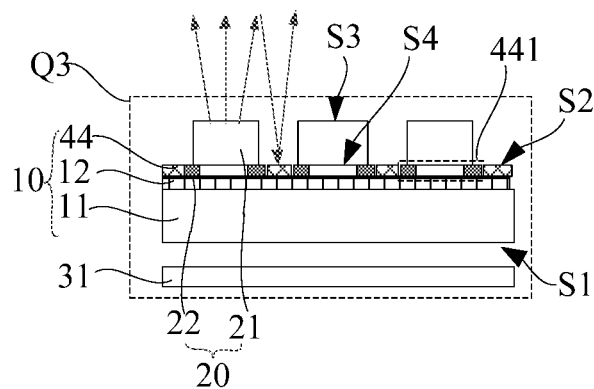
FIG. 15 illustrates an enlarged schematic diagram at Q3 of a light-emitting structure shown in FIG. 14, consistent with the disclosed embodiments of the present disclosure.
Figure 16:
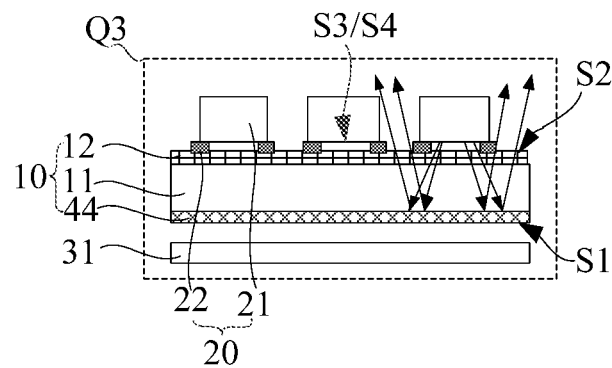
FIG. 16 illustrates an enlarged schematic diagram at Q3 of another light-emitting structure shown in FIG. 14, consistent with the disclosed embodiments of the present disclosure.
Figure 17:
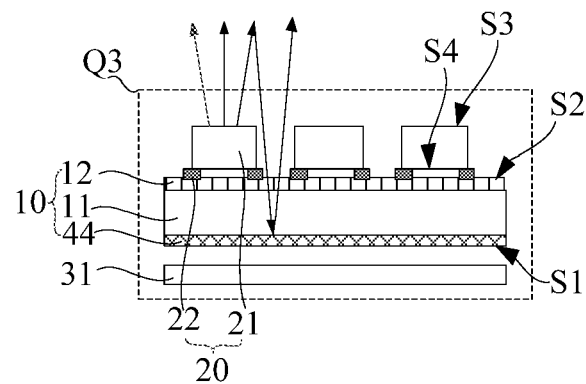
FIG. 17 illustrates an enlarged schematic diagram at Q3 of another light-emitting structure shown in FIG. 14, consistent with the disclosed embodiments of the present disclosure.
Figure 18:
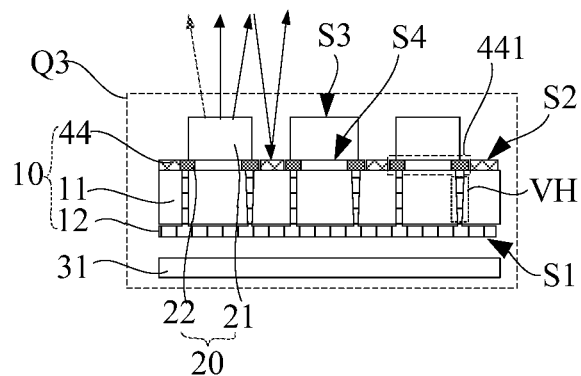
FIG. 18 illustrates an enlarged schematic diagram at Q3 of another light-emitting structure shown in FIG. 14, consistent with the disclosed embodiments of the present disclosure.

FIG. 14 illustrates a schematic cross-sectional view of another light-emitting structure consistent with the disclosed embodiments of the present disclosure. FIG. 15 illustrates an enlarged schematic diagram at Q3 of a light-emitting structure shown in FIG. 14. FIG. 16 illustrates an enlarged schematic diagram at Q3 of another light-emitting structure shown in FIG. 14. FIG. 17 illustrates an enlarged schematic diagram at Q3 of another light-emitting structure shown in FIG. 14. FIG. 18 illustrates an enlarged schematic diagram at Q3 of another light-emitting structure shown in FIG. 14. With reference to FIGS. 14 to 18, in some embodiments, the light-emitting element 20 may be located on the side of the second surface S2 of the circuit substrate 10, and the light-emitting structure 100 also includes a fourth reflective layer 44. The fourth reflective layer 44 may be located between the light-transparent substrate 11 and the light-emitting element 20, or the fourth reflective layer 44 may be located between the light-transparent substrate 11 and the heat sink. In this configuration, the fourth reflective layer 44 may reflect at least part of the light emitted by the light-emitting element 20, thereby increasing the light output of the light-emitting structure 100.

In some embodiments, as shown in FIG. 15, the fourth reflective layer 44 is located between the light-transparent substrate 11 and the light-emitting element 20. The fourth reflective layer 44 may include a second opening 441 penetrating the fourth reflective layer 44 along a thickness direction of the fourth reflective layer. The orthographic projection of the light-emitting element 20 on the light-transparent substrate 11 is located within an orthographic projection of the second opening 441 on the light-transparent substrate 11. In this configuration, the fourth reflective layer 44 may reflect the stray light of the light-emitting element 20 without affecting the light emitted by the light-emitting element 20. Accordingly, the light output of the light-emitting structure 100 may be increased, and the light-emission effect of the light-emitting element 20 may thus be improved.

In some embodiments, the fourth reflective layer 44 may be disposed on a side of the light-transparent substrate 11 along the thickness direction of the light-transparent substrate 11. In one embodiment, as shown in FIG. 15, the fourth reflective layer 44 may be disposed on the side of the light-transparent substrate 11 facing the light-emitting element 20 by an evaporation process. In another embodiment, as shown in FIG. 16, the fourth reflective layer 44 may be formed on the side of the light-transparent substrate 11 away from the light-emitting element 20 by an evaporation process. In one embodiment, when the fourth reflective layer 44 is disposed between the light-transparent substrate 11 and the heat sink 31, the fourth reflective layer 44 may be a reflective film. The reflective film may be bonded to a side of the heat sink 31 facing the circuit substrate 10. Through this configuration, the fourth reflective layer 44 may be stably arranged in the light-emitting structure 100.

With continuous reference to FIGS. 15 to 18, in some embodiments, the light-emitting element 20 also includes a pad 22 mounted on a side surface of the light-emitting block 21. The light-emitting block 21 is connected to the circuit substrate 10 through the pad 22. The light-emitting block 21 includes a light-exiting surface S3, and the light emitted by the light-emitting block 21 is emitted through the light-exiting surface S3.

As shown in FIG. 15, FIG. 17, and FIG. 18, the light-exiting surface S3 may be arranged opposite to a mounting surface S4 of the pad 22. Part of the stray light in the light emitted from the light-exiting surface S3 may be reflected by the fourth reflective layer 44, such that the light-emission brightness of the light-emitting structure 100 may be increased. As shown in FIG. 16, the light-exiting surface S3 may be on a same plane with the mounting surface S4 of the pad 22, and the fourth reflective layer 44 is located between the light-transparent substrate 11 and the heat sink 31. The light-emitting element 20 and the fourth reflective layer 44 may cooperate with each other, such that the light-emitting structure 100 may perform light-emitting display, and meanwhile the light-emitting structure 100 may have a high optical density (OD) value. Accordingly, the light-emission uniformity of the light-emitting structure 100 may be improved, and further the light-emission efficiency of the light-emitting structure 100 may be improved.

In some embodiments, as shown in FIG. 15, the light-exiting surface S3 is disposed opposite to the mounting surface S4 of the pad 22. The fourth reflective layer 44 is located between the light-transparent substrate 11 and the light-emitting element 20. The wiring structure 12 is located between the fourth reflective layer 44 and the light-transparent substrate 11. In some other embodiments, as shown in FIG. 18, the wiring structure 12 is located on a side of the light-transparent substrate 11 away from the fourth reflective layer 44. The wiring structure 12 and the light-emitting element 20 are connected through a via VH. When the wiring structure 12 is a wiring structure connected to a micro light-emitting element, the wiring structure 12 may include a gate layer. In the above configurations, the gate layer in the wiring structure 12 may be prevented from receiving light and generating photo-generated carriers. Accordingly, the stability of the electrical signal transmission of the wiring structure 12 may be improved.

In some embodiments, the circuit substrate 10 may be a rigid circuit substrate 10, and the heat sink 31 may be a metal heat sink 31. In some other embodiments, the circuit substrate 10 may be a flexible circuit substrate 10, and the heat sink 31 may be a graphite heat sink. By providing an appropriate heat sink 31, requirements of strength and bending performance of the light-emitting structure 100 may be met.

In summary, the light-emitting structure 100 provided by the present disclosure includes a circuit substrate 10, a plurality of light-emitting elements 20, and a heat sink 31. The circuit substrate 10 includes a light-transparent substrate 11 and a wiring structure 12 on a side of the light-transparent substrate 11. The wiring structure 12 is electrically connected to the light-emitting element 20 to realize light-emitting display of the light-emitting element 20. By disposing the heat sink 31 on a side of a first surface S1 in a light-exiting direction of the circuit substrate 10, the heat sink 31 may dissipate heat generated by the light-emitting element 20 during operation. As such, the light-emitting element 20 may be prevented from accumulating heat during operation, a problem of heat of the light-emitting element 20 may be alleviated, and light-emission efficiency of the light-emitting element 20 may be improved.

Figure 19:
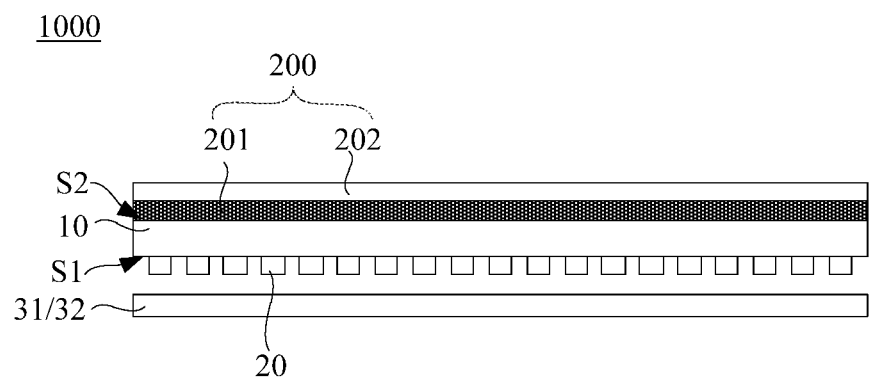
FIG. 19 illustrates a schematic structural diagram of a backlight module consistent with the disclosed embodiments of the present disclosure.

FIG. 19 illustrates a schematic structural diagram of a backlight module consistent with the disclosed embodiments of the present disclosure. The present disclosure also provides a backlight module 1000. As shown in FIG. 19, the backlight module 1000 includes a light-emitting structure 100 provided by the present disclosure and at least one optical film layer 200. The at least one optical film layer 200 is located on a side of the second surface S2 of the circuit substrate 10 of the light-emitting structure 100. In the backlight module 1000 provided by the present disclosure, by disposing the heat sink 31 on a side of the first surface S1 in a light-exiting direction of the circuit substrate 10, the heat sink 31 may dissipate heat generated by the light-emitting element 20 during operation. As such, the light-emitting element 20 may be prevented from accumulating heat during operation, a problem of heat of the light-emitting element 20 may be alleviated, and light-emission efficiency of the light-emitting element 20 may be improved.

In one embodiment, the at least one optical film layer 200 may include a diffusion sheet 201 and a brightness enhancement sheet 202 that are sequentially disposed in a direction away from the circuit substrate 10, such that the light output of the backlight module 100 may be increased. Accordingly, the light in the backlight module 100 may be effectively transmitted to the display panel.

The present disclosure also provides a display module. The display module includes a light-emitting structure 100 provided by the present disclosure. The display module may also directly perform light-emitting display. To realize color display of the display module, in one embodiment, the plurality of light-emitting elements 20 arranged in an array may include a plurality of light-emitting elements 20 with different light-emitting colors. In one embodiment, the plurality of light-emitting elements 20 may include a red light-emitting element 20, a green light-emitting element 20, and a blue light-emitting element 20. In some other embodiments, the plurality of light-emitting elements 20 may also include a white light-emitting elements 20 or a yellow light-emitting element 20. In the above configurations, the heat sink 31 in the display module may dissipate heat generated by the light-emitting element 20 during operation. Accordingly, the light-emitting element 20 may be prevented from accumulating heat during operation, the problem of heat of the light-emitting element 20 may be alleviated, and light-emission efficiency of the display module may be improved.

Figure 20:
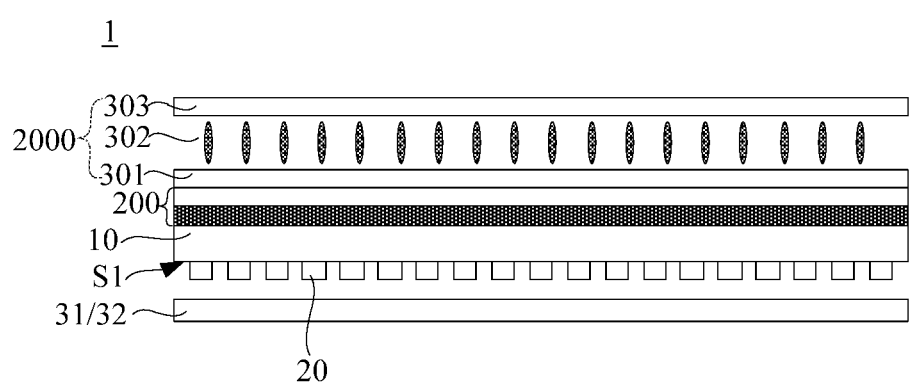
FIG. 20 illustrates a schematic structural diagram of a display device consistent with the disclosed embodiments of the present disclosure.

FIG. 20 illustrates a schematic structural diagram of a display device consistent with the disclosed embodiments of the present disclosure. The present disclosure also provides a display device 1. As shown in FIG. 20, the display device 1 may include a backlight module 1000 provided by the present disclosure or a display module provided by the present disclosure.

When the display device 1 includes the backlight module 1000, the display device 1 may also include a liquid crystal display panel 2000 on a side of the light-exiting surface of the backlight module 1000. The liquid crystal display panel 2000 may include an array substrate 301 and a color film substrate 303 that are arranged oppositely, and a liquid crystal layer 302 sandwiched between the array substrate 301 and the color film substrate 303. The backlight module 1000 is configured to provide a light source for the liquid crystal display panel 2000, such that the liquid crystal display panel 2000 may perform light-emitting display.

In one embodiment, the display device 1 may include a heat sink 31, and the heat sink 31 may dissipate the heat generated by the light-emitting element 20 during operation. Accordingly, the light-emitting element 20 may be prevented from accumulating heat during operation, the problem of heat of the light-emitting element 20 may be alleviated, and the light-emission efficiency of the display device 1 may be improved.

As disclosed, the technical solutions of the present disclosure have the following advantages.

According to the light-emitting structure, the backlight module, the display module and the display device provided by the present disclosure, the light-emitting structure includes a circuit substrate, a plurality of light-emitting elements, and a heat sink. The circuit substrate includes a light-transparent substrate and a wiring structure on a side of the light-transparent substrate. The wiring structure is electrically connected with the light-emitting element to realize light-emitting display of the light-emitting element. By disposing the heat sink on a side of a first surface in a light-exiting direction of the circuit substrate, the heat sink may dissipate heat generated by the light-emitting element during operation. As such, the light-emitting element may be prevented from accumulating heat during operation, and light-emission efficiency of the light-emitting element 20 may thus be improved.

The embodiments disclosed herein are exemplary only and not limiting the scope of this disclosure. Various combinations, alternations, modifications, equivalents, or improvements to the technical solutions of the disclosed embodiments can be obvious to those skilled in the art. Without departing from the spirit and scope of this disclosure, such combinations, alternations, modifications, equivalents, or improvements to the disclosed embodiments are intended to be encompassed within the scope of the present disclosure.

What is claimed is:

1. A light-emitting structure, comprising:
    a circuit substrate, including a first surface and a second surface sequentially arranged along a light-exiting direction of the light-emitting structure, wherein the circuit substrate further includes a light-transparent substrate and a wiring structure located on a side of the light-transparent substrate in a thickness direction;
    a plurality of light-emitting elements, arranged in an array on one of the first surface or the second surface of the circuit substrate, wherein the plurality of the light-emitting elements is electrically connected to the wiring structure, a the light-emitting element of the light-emitting elements includes a light-emitting block and a pad mounted on a side surface of the light-emitting block, the light-emitting block is electrically connected to the wiring structure of the circuit substrate through the pad, the light-emitting block has a light-exiting surface, and the light-exiting surface and a mounting surface of the pad are on a same plane; and
    a heat sink, located on a side of the first surface of the circuit substrate, wherein the heat sink is configured for dissipating heat generated by the plurality of the light-emitting elements.

2. The light-emitting structure according to claim 1, further comprising:
a support frame, located on the side of the first surface of the circuit substrate, wherein:
the support frame is multiplexed as the heat sink; or
the support frame is located on a side of the heat sink away from the circuit substrate.

3. The light-emitting structure according to claim 1, wherein:
the light-emitting element of the plurality of light-emitting elements is located between the first surface of the circuit substrate and the heat sink.

4. The light-emitting structure according to claim 3, wherein:
the light-emitting structure further includes a first reflective layer located between the light-emitting block and the heat sink.

5. The light-emitting structure according to claim 1, wherein:
the wiring structure is located on a side of the light-transparent substrate facing the light-emitting element;
the circuit substrate further includes a second reflective layer located between the wiring structure and the light-transparent substrate;
the second reflective layer includes a first opening penetrating the second reflective layer along a thickness direction of the second reflective layer; and
an orthographic projection of the light-emitting element on the light-transparent substrate is located within an orthographic projection of the first opening on the light-transparent substrate.

6. The light-emitting structure according to claim 5, wherein:
a contour of the orthographic projection of the light-emitting element on the light-transparent substrate at least partially overlaps with a contour of the orthographic projection of the first opening on the light-transparent substrate.

7. The light-emitting structure according to claim 3, wherein:
the wiring structure is located on a side of the light-transparent substrate facing away from the light-emitting element; and
the light-emitting element is connected to the wiring structure through a via.

8. The light-emitting structure according to claim 7, wherein:
the circuit substrate further includes a third reflective layer on a side of the wiring structure facing away from the light-transparent substrate;
the third reflective layer includes a light transmission hole penetrating the third reflective layer along a thickness direction of the third reflective layer; and
an orthographic projection of the light-emitting element on the light-transparent substrate is located within an orthographic projection of the light transmission hole on the light-transparent substrate.

9. The light-emitting structure according to claim 3, further comprising:
a protective component, located between the heat sink and the light-emitting element.

10. The light-emitting structure according to claim 1, wherein:
the plurality of light-emitting elements is located on a side of the second surface of the circuit substrate; and
the light-emitting structure further includes a fourth reflective layer, wherein:
the fourth reflective layer is located between the light-transparent substrate and the plurality of light-emitting elements; or
the fourth reflective layer is located between the light-transparent substrate and the heat sink.

11. The light-emitting structure according to claim 10, wherein:
the fourth reflective layer is located between the light-transparent substrate and the plurality of light-emitting elements;
the fourth reflective layer includes a second opening penetrating the fourth reflective layer along a thickness direction of the fourth reflective layer; and
an orthographic projection of a light-emitting element of the plurality of light-emitting elements on the light-transparent substrate is located within an orthographic projection of the second opening on the light-transparent substrate.

12. The light-emitting structure according to claim 10, wherein:
the fourth reflective layer is disposed on a side of the light-transparent substrate along the thickness direction of the light-transparent substrate; or
the fourth reflective layer is a reflective film, wherein the reflective film is bonded to a side of the heat sink facing the circuit substrate.

13. The light-emitting structure according to claim 10, wherein:
the light-emitting block includes a light-exiting surface, wherein:
the light-exiting surface and the mounting surface of the pad are on a same plane, and the fourth reflective layer is located between the light-transparent substrate and the heat sink.

14. The light-emitting structure according to claim 13, wherein:
the fourth reflective layer is located between the light-transparent substrate and the plurality of light-emitting element,
wherein:
the wiring structure is located between the fourth reflective layer and the light-transparent substrate; or
the wiring structure is located on a side of the light-transparent substrate facing away from the fourth reflective layer, and the wiring structure and the plurality of light-emitting element are connected through a via.

15. The light-emitting structure according to claim 1, wherein:
the circuit substrate includes protruding structures arranged in an array on a surface of the light-transparent substrate, wherein:
the protruding structure is arranged directly opposite to the light-emitting element; or
an orthographic projection of the protruding structure on the light-transparent substrate is located between orthographic projections of two adjacent light-emitting elements on the light-transparent substrate.

16. The light-emitting structure according to claim 1, wherein the light-emitting element is a micro light-emitting element, wherein:
the circuit substrate is a rigid circuit substrate, and the heat sink is a metal heat sink; or
the circuit substrate is a flexible circuit substrate, and the heat sink is a graphite heat sink.

17. A backlight module, comprising:
a light-emitting structure, comprising:
  a circuit substrate, including a first surface and a second surface sequentially arranged along a light-exiting direction of the light-emitting structure, wherein the circuit substrate further includes a light-transparent substrate and a wiring structure located on a side of the light-transparent substrate in a thickness direction;
  a plurality of light-emitting elements, arranged in an array on one of the first surface or the second surface of the circuit substrate, wherein the plurality of the light-emitting elements is electrically connected to the wiring structure, a the light-emitting element of the light-emitting elements includes a light-emitting block and a pad mounted on a side surface of the light-emitting block, the light-emitting block is electrically connected to the wiring structure of the circuit substrate through the pad, the light-emitting block has a light-exiting surface, and the light-exiting surface and a mounting surface of the pad are on a same plane; and
  a heat sink, located on a side of the first surface of the circuit substrate, wherein the heat sink is configured for dissipating heat generated by the plurality of the light-emitting elements, and
at least one optical film layer, located on a side of the second surface of the circuit substrate of the light-emitting structure.

18. The backlight module according to claim 17, wherein:
the at least one optical film layer includes a diffusion sheet and a brightness enhancement sheet, wherein:
the diffusion sheet and the brightness enhancement sheet are sequentially disposed in a direction away from the circuit substrate.

19. A display device, comprising:
a display module, comprising a light-emitting structure, the light-emitting structure comprising:
  a circuit substrate, including a first surface and a second surface sequentially arranged along a light-exiting direction of the light-emitting structure, wherein the circuit substrate further includes a light-transparent substrate and a wiring structure located on a side of the light-transparent substrate in a thickness direction;
  a plurality of light-emitting elements, arranged in an array on one of the first surface or the second surface of the circuit substrate, wherein the plurality of the light-emitting elements is electrically connected to the wiring structure, a the light-emitting element of the light-emitting elements includes a light-emitting block and a pad mounted on a side surface of the light-emitting block, the light-emitting block is electrically connected to the wiring structure of the circuit substrate through the pad, the light-emitting block has a light-exiting surface, and the light-exiting surface and a mounting surface of the pad are on a same plane; and
  a heat sink, located on a side of the first surface of the circuit substrate, wherein the heat sink is configured for dissipating heat generated by the plurality of the light-emitting elements.

* * * * *